(12) United States Patent
Tsironis

(10) Patent No.: US 11,688,919 B1
(45) Date of Patent: Jun. 27, 2023

(54) LOW PROFILE MILLIMETERWAVE LOAD PULL TUNER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 85 days.

(21) Appl. No.: 17/197,307

(22) Filed: Mar. 10, 2021

(51) Int. Cl.
*H01P 5/04* (2006.01)
*H03H 7/40* (2006.01)
*G01R 35/00* (2006.01)
*G01R 31/28* (2006.01)
*G01R 27/32* (2006.01)

(52) U.S. Cl.
CPC .............. *H01P 5/04* (2013.01); *G01R 27/32* (2013.01); *G01R 31/2822* (2013.01); *G01R 35/007* (2013.01); *H03H 7/40* (2013.01)

(58) Field of Classification Search
CPC ...... H03H 7/40; H03J 1/00; H03J 1/06; H03J 3/00
See application file for complete search history.

(56) References Cited

U.S. PATENT DOCUMENTS

| | | |
|---|---|---|
| 9,257,963 B1 | 2/2016 | Tsironis |
| 9,276,551 B1 | 3/2016 | Tsironis |
| 9,620,842 B1 * | 4/2017 | Tsironis .................. H03H 7/40 |
| 9,625,556 B1 | 4/2017 | Tsironis |
| 9,647,629 B1 * | 5/2017 | Tsironis .................. H03H 7/38 |
| 9,899,984 B1 * | 2/2018 | Tsironis ............. G01R 31/2822 |
| 10,276,910 B1 * | 4/2019 | Tsironis .................. H01P 5/183 |
| 10,429,484 B1 * | 10/2019 | Tsironis .................. H03H 7/40 |
| 10,693,437 B1 | 6/2020 | Tsironis |
| 10,700,402 B1 | 6/2020 | Tsironis |

OTHER PUBLICATIONS

Load Pull, [online], Wikipedia [Retrieved on Nov. 18, 2016] Retrieved from Internet <URL:http://en.wikipedia.org/wiki/Load_pull>.
"Computer Controlled Microwave Tuner—CCMT," Product Note 41, Focus Microwaves Inc., Jan. 1998.
"Computer Controller Microwave Tuner, CCMT-5010 (1-50GHz)", Datasheet, Focus Microwaves Inc.
"Cam Mechanism" [online], Google Search [Retrieved on Jan. 7, 2018] Retrieved from Internet <URL: https://www.google.ca/search?dcr=0&source =hp&ei=7jZWWv_ZI-SfjwTlspSwAg&q=cam+mechanisim&oq=cam+mechanisim&gs_I=psy-ab.3..0i10k1l10.3174.7778.0.8197.14.12.0.2.2.0.190.1513.1j11.12.0. . . . 0. . . 1c.1.64.psy-ab.0.14.1561 . . . 0j0i131k1.0.pv0ojRndObU>.

* cited by examiner

*Primary Examiner* — Jermele M Hollington
*Assistant Examiner* — Temilade S Rhodes-Vivour

(57) ABSTRACT

A low-profile impedance tuner uses a cam-driven piston-like vertical movement of a metallic tuning probe inside a low loss slabline, controlled by an eccentrically centered disc (cam), which is attached to the axis of a stepper motor and rotates parallel to the slabline walls. The structure combines the benefits of low profile rotating tuning probe control with the benign reflection factor phase trajectory of block tuning probes; this is critical for accurate interpolation and impedance synthesis (tuning) strategies using a limited number of calibration points, especially at high microwave and millimeter-wave frequencies.

6 Claims, 14 Drawing Sheets

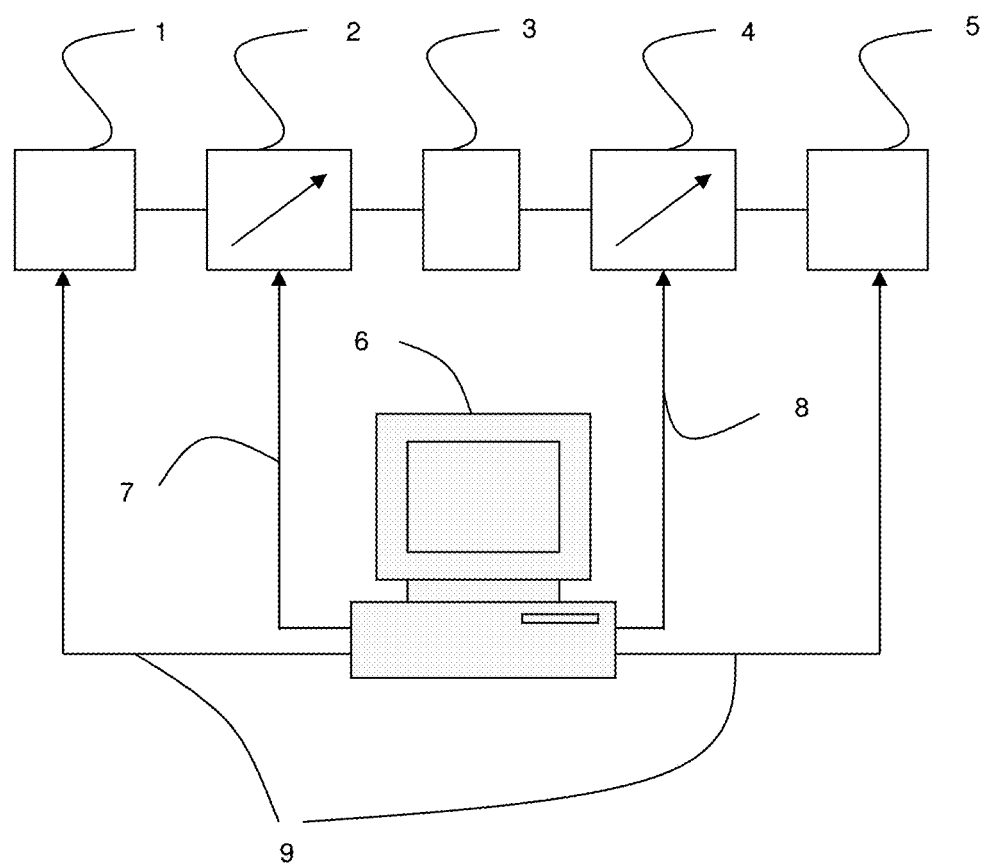
FIG. 1: Prior art

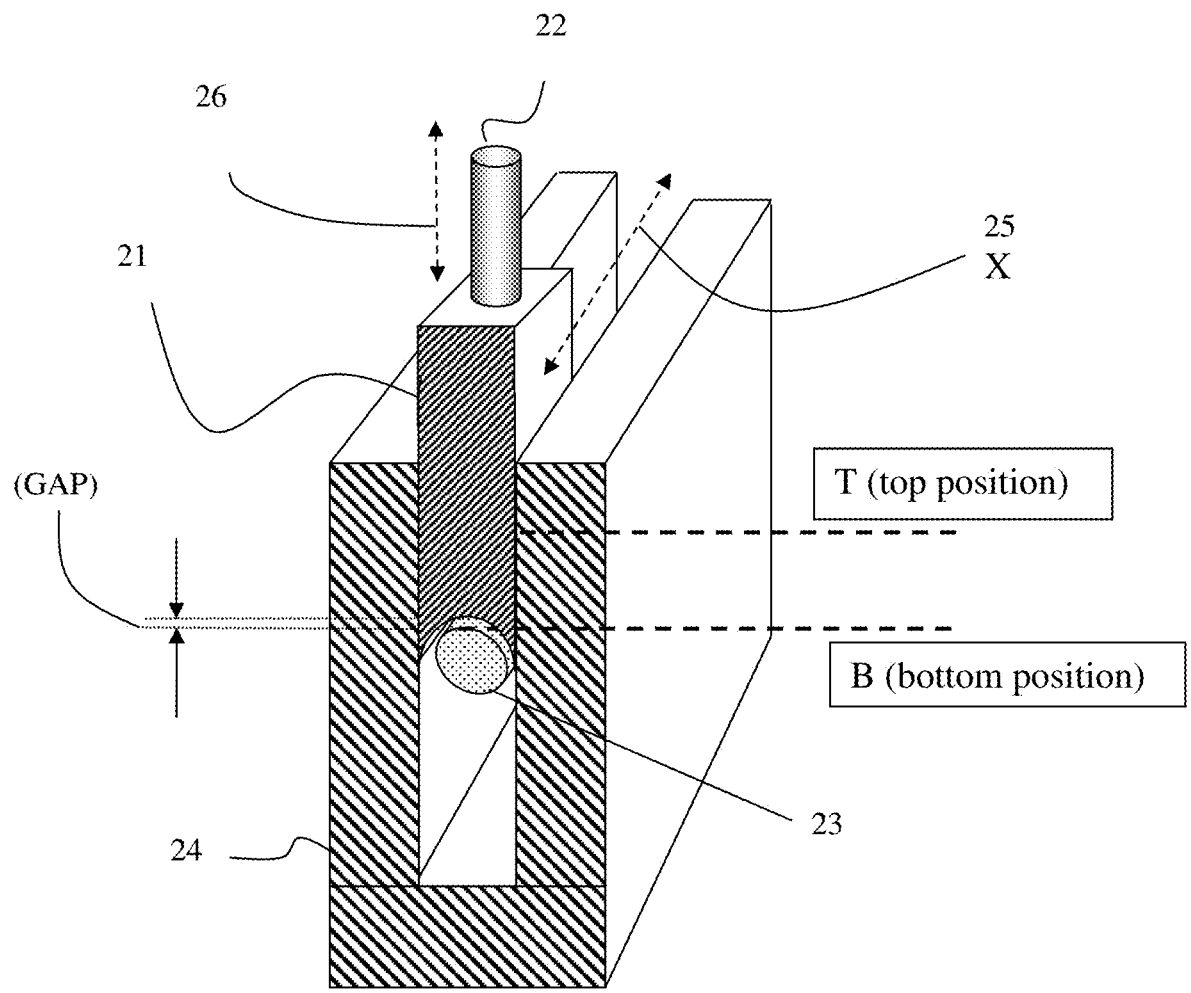
FIG.2: Prior art

FIG. 3A: Prior art
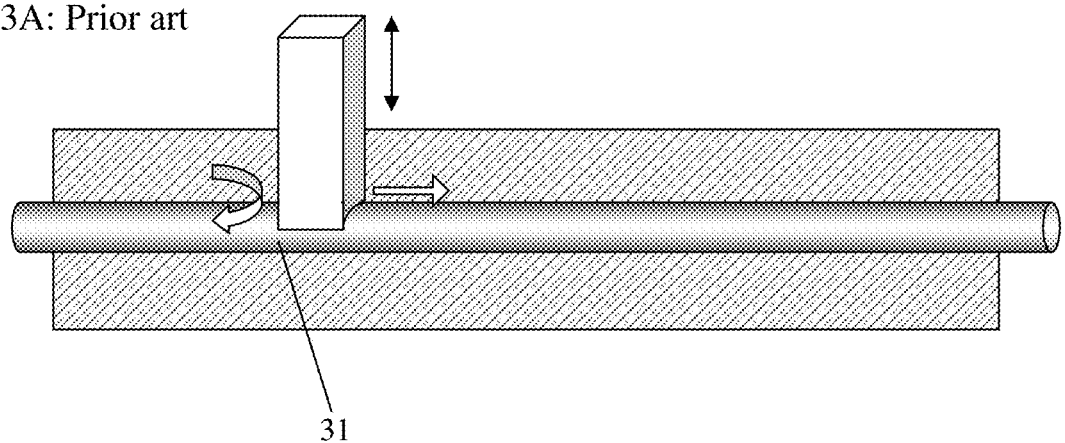
FIG. 3B: Prior art
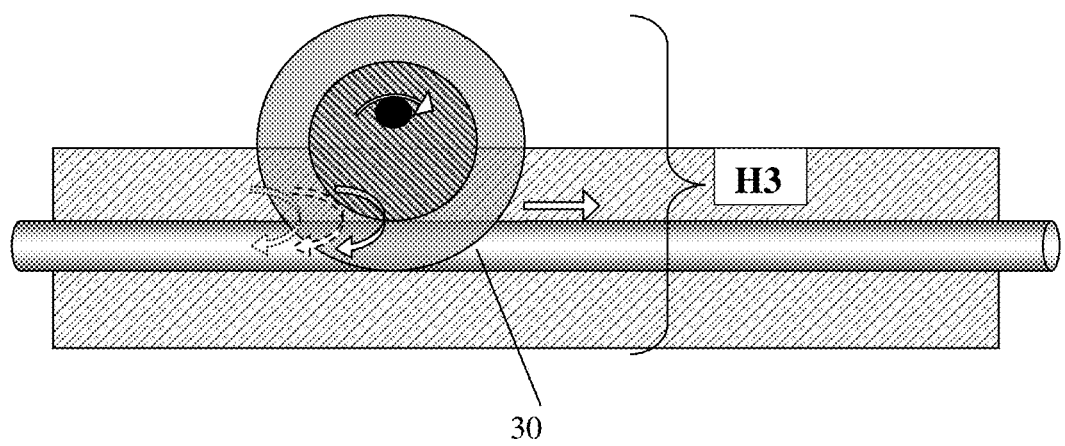

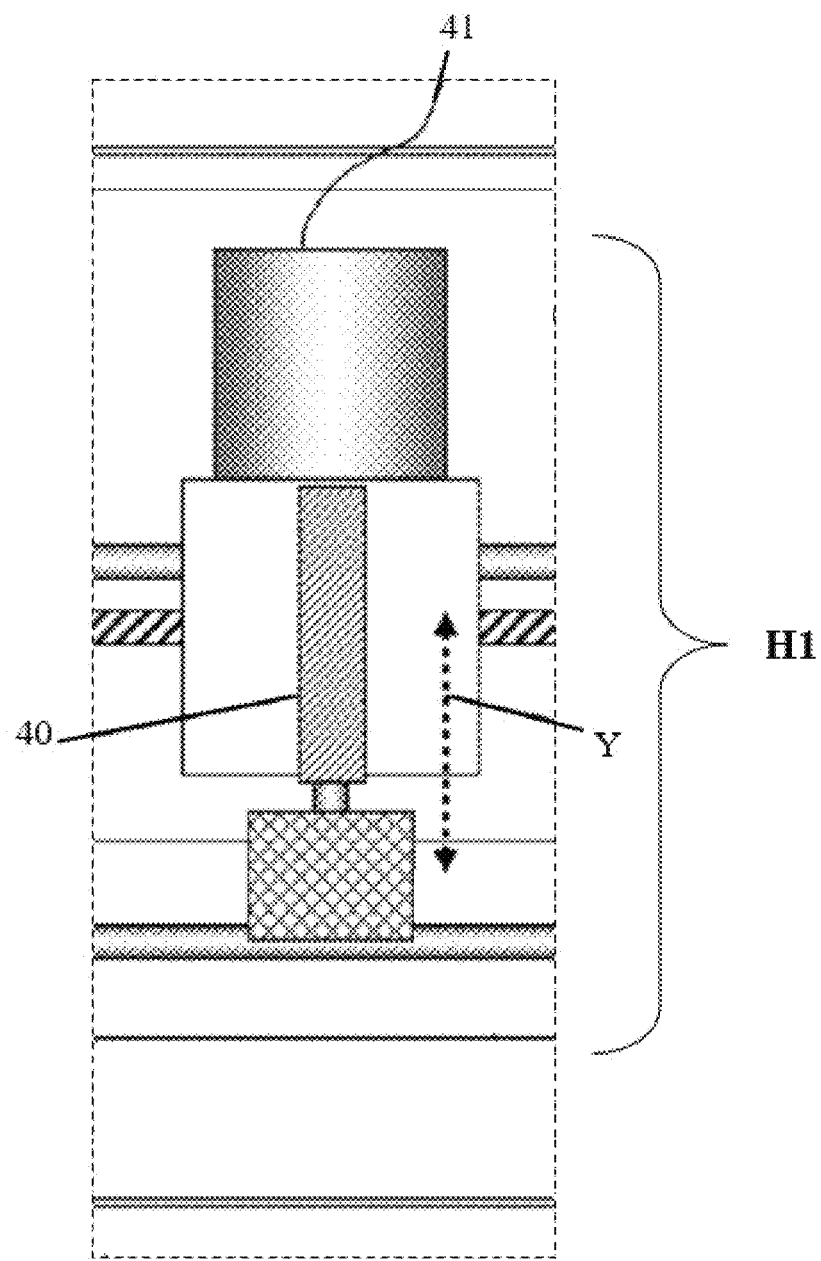
FIG. 4: Prior art

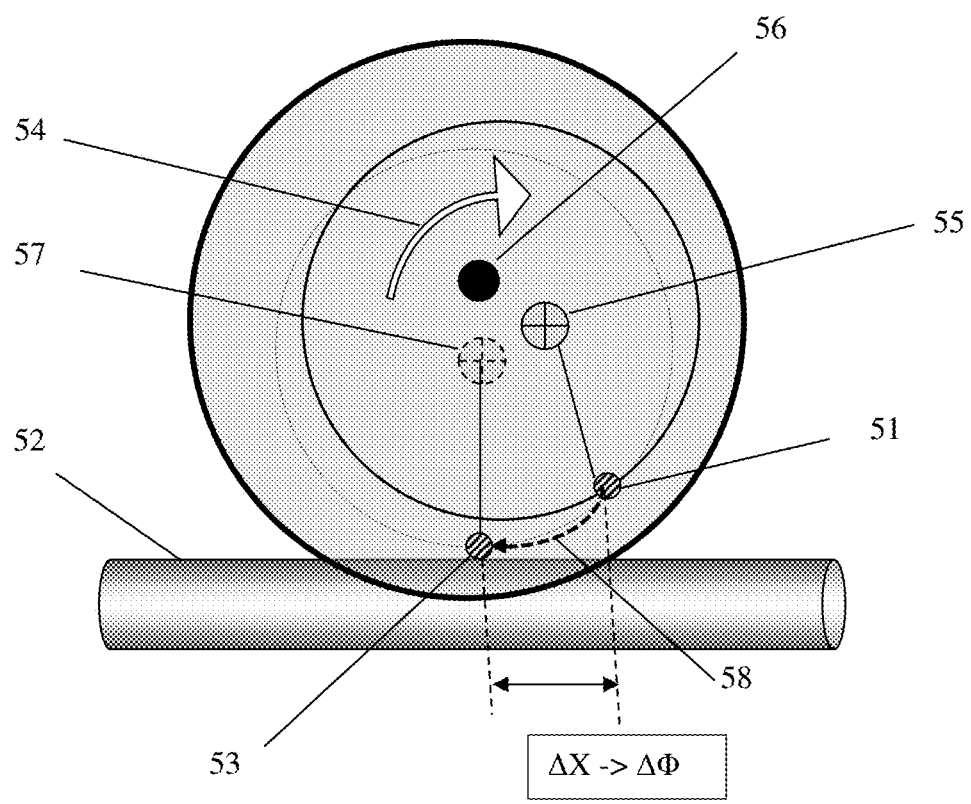
FIG. 5: Prior art

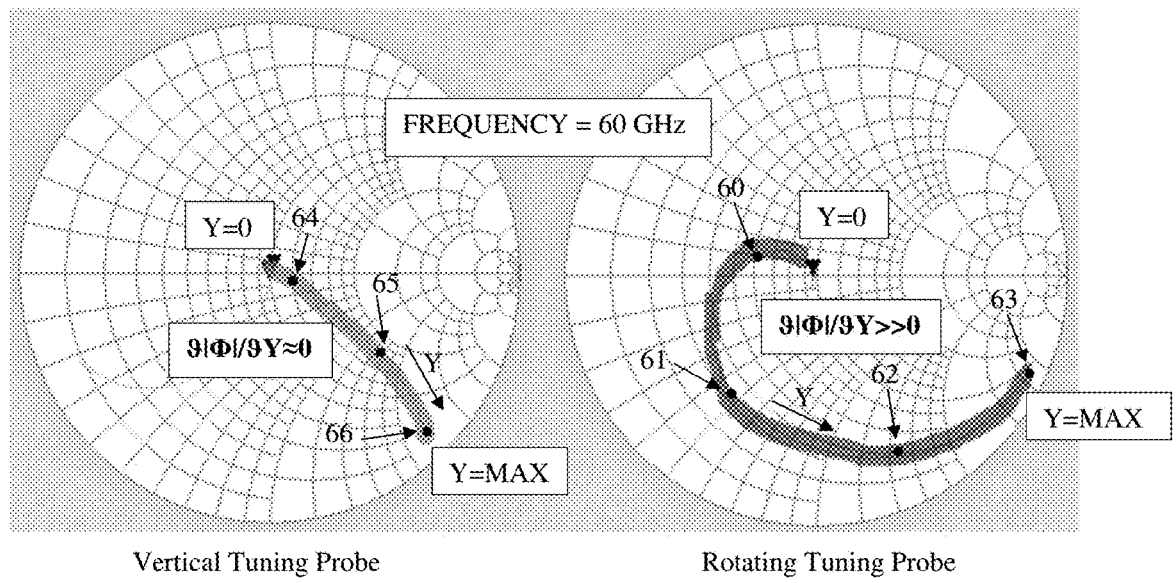
Vertical Tuning Probe
FIG. 6A: Prior art
Rotating Tuning Probe
FIG. 6B: Prior art

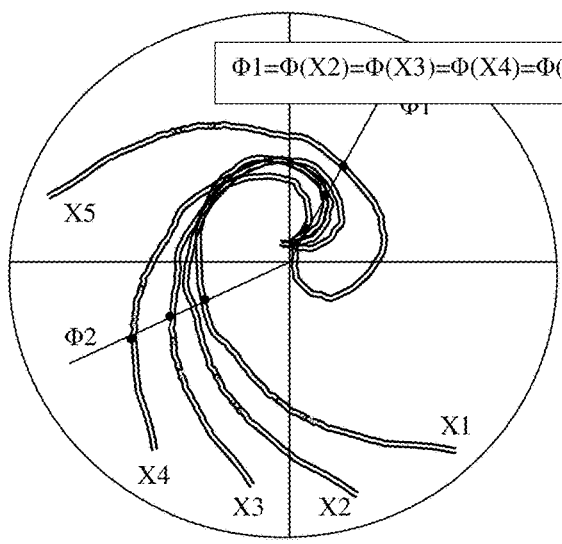
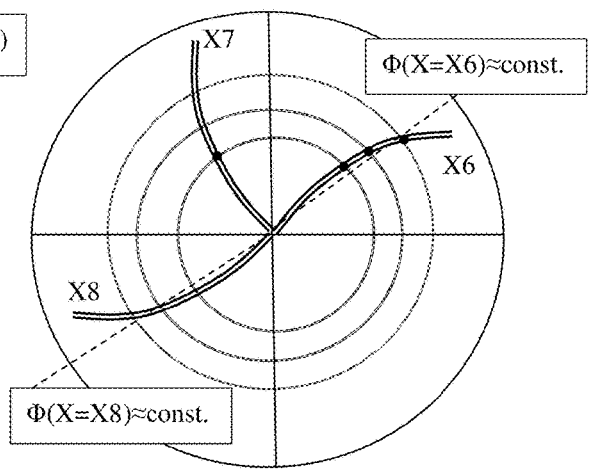
FIG.11A: Prior art
FIG.11B: Prior art

LOW PROFILE MILLIMETERWAVE LOAD PULL TUNER

PRIORITY CLAIM

This application claims priority on provisional application No. 62/988,200, filed on Mar. 11, 1920, titled: "Low Profile Millimeterwave Load Pull Tuner".

CROSS-REFERENCE TO RELATED ARTICLES

1. Load Pull Measurements" [online], Wikipedia [Retrieved on Nov. 18, 2016] Retrieved from Internet <URL: http://en.wikipedia.org/wiki/Load_pull>
2. "Computer Controlled Microwave Tuner—CCMT", Product Note 41, Focus Microwaves January 1998.
3. "Computer Controller Microwave Tuner, CCMT-5010 (1-50 GHz)", Datasheet, Focus Microwaves Inc.
4. Tsironis C., U.S. Pat. No. 10,700,402, "Compact millimetre-wave tuner", FIG. 14B.
5. Tsironis C., U.S. Pat. No. 9,276,551, "Impedance Tuner with Rotating Multi-Section Probes".
6. Tsironis C., U.S. Pat. No. 9,620,842, "Compact Two Probe Impedance Tuner".
7. Tsironis C., U.S. Pat. No. 9,257,963, "Impedance Tuners with Rotating Probes".
8. Tsironis C., U.S. Pat. No. 9,625,556, "Method for Calibration and Tuning with Impedance Tuners".
9. "Cam Mechanism" [online], Google Search [Retrieved on Jan. 7, 2018] Retrieved from Internet <URL: https://www.google.ca/search?dcr-0&source=hp&ei=7jZWWv_ZI-SfjwTIspSwAg&q=cam+mechanisim&oq=cam+mechanisim&gs_1=psy-ab.3..0i10k1l10.3174.7778.0.8197.14.12.0.2.2.0.190.1513.1j11.12.0....0...1c.1.64.psy-ab..0.14.1561...0j0i131k1.0.pv0ojRndObU>
10. Tsironis, C., U.S. Pat. No. 10,693,437, "High Gamma on-wafer Load Pull test system", FIG. 6.

BACKGROUND OF THE INVENTION

This invention relates to RF (radio frequency) load and source pull testing of medium and high-power RF transistors and amplifiers using remote controlled electro-mechanical impedance tuners. Modern design of high-power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models only.

A popular method for testing and characterizing such microwave D U T (device under test) components (transistors) in the non-linear region of operation is "load pull" (see ref. 1). Load pull is a measurement technique employing microwave tuners and other microwave test equipment as shown in FIG. 1. The microwave tuners (2, 4) are used in order to manipulate the microwave impedance conditions under which the Device Under Test (DUT, 3) is tested, see ref. 1; the signal is provided by a signal source (1) and the outcoming power is measured by a power meter (5); the whole is controlled by a PC (6), which controls the instruments and the tuners using digital control cables (7, 8 and 9).

DESCRIPTION OF PRIOR ART

Block-formed tuning probes (slugs) have the typical form shown in FIG. 2. The block (slug) body (21) has a concave cylindrical bottom similar the shape of the, typically cylindrical, center conductor (23) of the slabline (24) and is attached to a holding rod (22) which is attached to a precision vertical axis (40) (see FIG. 4) controlled by a vertical motor (41). The vertical axis moves (Y) the probe (21) towards and away (26) from the center conductor (23) between a Top and a Bottom position. This controls the amount of reflected signal amount from the signal injected into the slabline and thus the amplitude of the reflection factor, created by the tuning probe. A different mechanism moves the probe horizontally (X) along (25) the slabline. This controls the phase of the reflection factor relative to a reference test port. The cartesian movement (X, Y) corresponds to an equivocal polar movement of the complex reflection factor $\Gamma=|\Gamma|*\exp(j\Phi)$ with $|\Gamma|\approx|\Gamma(Y)|$ and $\Phi=\Phi(X)$. Interpolation between calibration points and impedance synthesis (tuning) algorithms have, so far, been based on this specific coordinate system best describing the hitherto natural tuner behavior.

Eccentrically rotating tuning probes in tuners (see refs. 5 and 7) offer an efficient method of reducing the height of a tuner body towards a low-profile H3 (FIG. 3B) unit allowing easier integration into the cramped area (see ref. 10) around a wafer probe station (see ref. 5, 6, 7 and FIG. 3B). Whereas a traditional vertical axis requires a minimum height H1 (FIG. 4) to provide guidance, precision and stability of the vertically moving tuning probe (40), the corresponding mechanism using a rotating probe allows for a height reduction of typically a factor of 2 (H3 in FIG. 3B). The reflection is created essentially at the closest point between the rotating tuning probe (30) in FIG. 3B, or the non-rotating tuning probe (31) in FIG. 3A, and the center conductor.

However (FIG. 5), as the probe rotates (54) around the eccentric rotation axis (56), the center of the disc (55) moves to (57) and the reflective area (51) moves on a curved trajectory (58) towards area (53) closer to the center conductor (52). This means that, even though the axis (56) does not move horizontally, the reflecting area does. This creates a horizontal shift $\Delta X$ leading to a phase change $|\Delta\Phi|=4\pi*|\Delta X|/\lambda$. At low frequencies this phase change is imperceptible, since $|\Delta X|<<\lambda$ leading to approximately linear trajectory (64, 65, 66) shown in FIG. 6A. But as the frequency increases, the few millimeters of $\Delta X$ come closer to $\lambda$ and affect the behavior of the reflection factor trajectory (FIG. 6B, items 60, 61, 62, 63).

Tuning is the process of synthesizing physically a given reflection factor, or impedance. The relation between the two is: $Z=Zo*(1+\Gamma)/(1-\Gamma)$. $\Gamma=0$ is at the center of the Smith chart and corresponds to $Z=Zo=50\Omega$, $\Gamma=1$ is at the right edge and corresponds to $Z=\infty$, and $\Gamma=-1$ is at the left edge and corresponds to $Z=0$. Zo is the characteristic impedance of the system, typically $50\Omega$. To synthesize any impedance the tuner not only must have a very high tuning resolution, which, when using appropriate gear reduction, is easily feasible, but the calibration must either contain a huge number of calibrated points, or be able to be interpolated accurately between calibration points. The existing interpolation techniques allow such procedures for tuner behaviors generated using vertical tuning probes (FIG. 6A and ref. 8). In the case of rotating tuning probes (FIGS. 3B, 5 and 6B) the method does not work, because the unambiguous cartesian relation between amplitude and phase of the reflection factor, caused by the horizontal (phase) and vertical (amplitude) movement of the tuning probe, is lost. For the accurate interpolation theory between calibration points to work it must be: $\partial|\Phi|/\varepsilon Y\approx 0$, which is valid for a vertical tuning probe (FIG. 6A) but clearly invalid for a rotating probe (FIG.

6B). As FIG. 11A also shows, the additional handicap facing interpolation and tuning (impedance synthesis) algorithms of rotating probes is the multitude of horizontal positions Xi yielding the same phase $\Phi 1$, $\Phi 2$ . . . other than a cartesian grid, where each pair {Xi, Yj} of horizontal and vertical positions of the tuning probe yields a single and unique reflection factor $\Gamma_k = |\Gamma_k| * \exp(j\Phi_k)$; see FIG. 11B, where on each circle Y=const. for each horizontal X position, there is always a unique phase $\Phi$. To solve this problem for a low-profile millimeter-wave tuner, which has been hitherto possible only by using rotating tuning probes, either a new coordinate system is required or a new probe control concept is needed, for non-rotating tuning probes having a reflection factor trajectory like the vertical probes of FIG. 6A. This is possible by combining the eccentric rotation ("cam", see ref. 9) mechanism with straight vertically, piston-like, moving tuning probes.

BRIEF DESCRIPTION OF THE SEVERAL VIEWS OF THE DRAWINGS

The invention and its mode of operation will be more clearly understood from the following detailed description when read with the appended drawings in which:

FIG. 1 depicts prior art, a typical automated transistor load pull test system.

FIG. 2 depicts prior art, a perspective view and relevant dimensions and parameters of the operation of a vertically operating RF tuning probe (slug).

FIG. 3A through 3B depict prior art, two tuning probe concepts: FIG. 3A depicts the traditional vertical tuning probe; FIG. 3B depicts the rotating tuning probe concept.

FIG. 4 depicts prior art, the cross section of the vertical tuning probe control mechanism (extract from FIG. 2 in ref. 7).

FIG. 5 depicts prior art, the detailed operation and relevant dimensions of a rotating tuning probe.

FIG. 6A through 6B depict prior art, FIG. 6A depicts the reflection factor amplitude control of a vertically moving probe and FIG. 6B depicts the reflection factor amplitude control of a rotating probe at higher frequencies (typically above 15 or 18 GHz).

FIG. 11A through 11B depict prior art, FIG. 11A depicts vertical probe movement reflection factor trajectories of rotating probes for various horizontal probe positions. FIG. 11B depicts vertical probe movement reflection factor trajectories of vertical moving block probes for various horizontal probe positions.

DETAILED DESCRIPTION OF THE INVENTION

This invention discloses an automated low-profile load pull tuner apparatus suitable for optimum integration in on-wafer test setups for testing of semiconductor microchips at high and very high (millimeter-wave) frequencies (see ref. 4). Low-profile is defined here in comparison with prior art automated slide-screw tuners (FIG. 4, see ref. 3). A reduction of height perpendicular to the slabline by a factor of at least 2 is hereby defined as low-profile. Typical body height of traditional tuners is approximately 6.6" (see ref. 3); therefore, a structure of maximum 3.2" height is hereby considered low-profile. Such structures have been possible using rotating tuning probes (see ref. 4, 5, 6, 7), but are not suitable for frequencies higher than approximately 18 GHz, due to the strong curvature of their tuning trajectory (FIGS. 5 and 6B). The new solution combines the cam mechanism with a vertically moving tuning probe (see ref. 9 and FIG. 8, 9).

Figure 7:
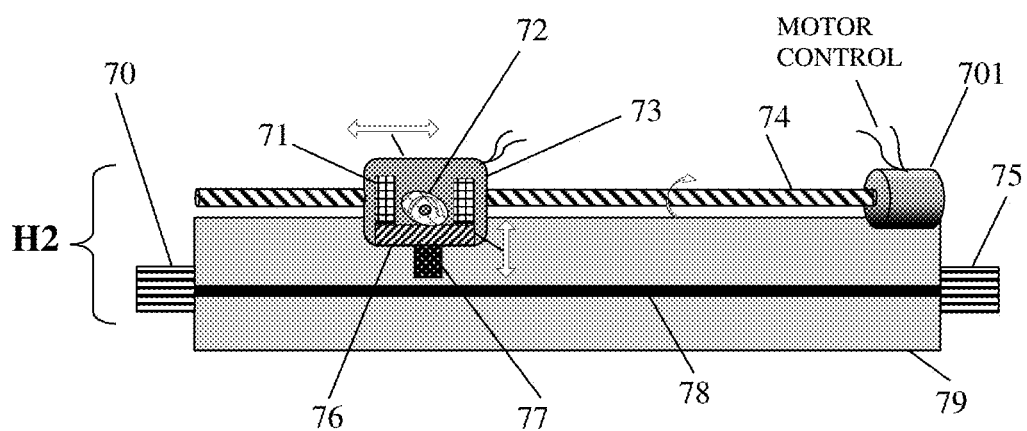
FIG. 7 depicts a front view of the overall concept of a low-profile tuner combining a piston-like vertically moving tuning probe driven by an eccentrically rotating "cam" mechanism.
Figure 8:
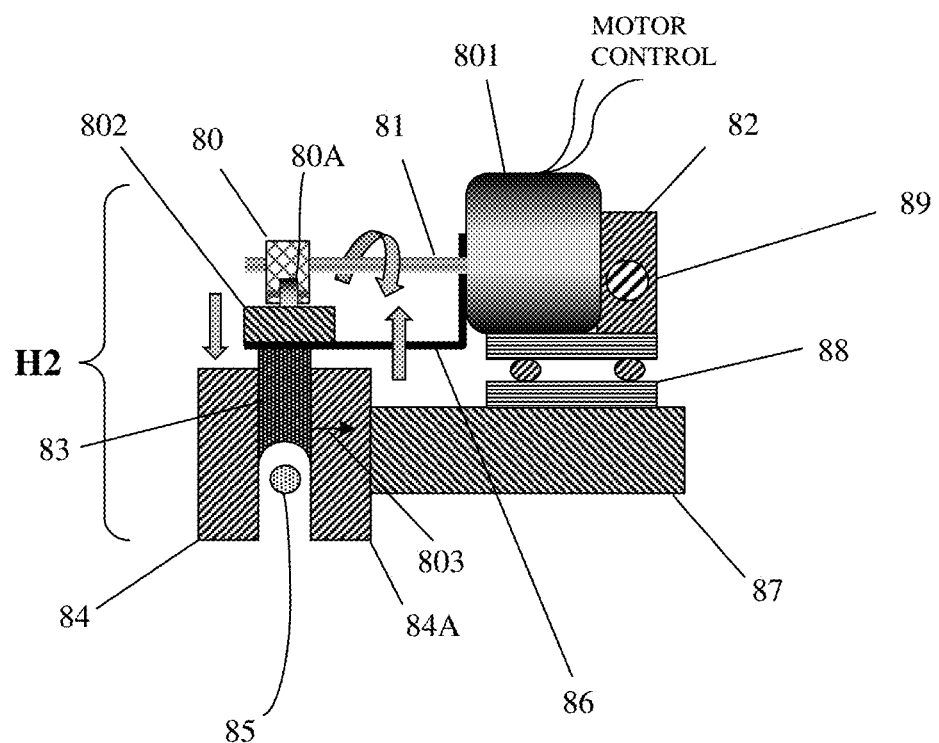
FIG. 8 depicts a cross section of the overall concept of piston-like vertically moving tuning probe driven by an eccentrically rotating mechanism.

The front view of the new tuner apparatus alongside the slabline is shown in FIG. 7. It comprises a slabline (79) with a center conductor (78) centered between two vertical conductive sidewalls (84) and (84A), a test port (70) and an idle port (75). Throughout this disclosure the item "slabline" is typically indicated by pointing (84) on at least one sidewall (FIG. 8). A horizontal ACME rod (74), controlled by the horizontal stepper motor (701), moves the carriage (82) and the vertical stepper motor (73), (801) along the slabline (79) parallel to the center conductor (78). The axis (81) of the vertical stepper motor (801) rotates perpendicular to the broad surface of the sidewall (84A) of the slabline and controls the eccentric rotation of a disc (72), (80) which, creating a "cam" mechanism (see ref. 9), pushes downwards, piston-like toward the center conductor, the support block (76), (802) and the attached to it tuning probe (77), (83). The support block (76), (802) is pulled upwards by two narrow pre-loaded steel angles (71), (86) or one wide steel angle (120) shown in FIG. 12, which pull upwards against the downward pressure of the cam (disc (72), (80)). This creates the linearized vertical tuning trajectory response shown in FIG. 6A.

FIG. 8 shows the new mechanism in more detail: The block-formed tuning probe (83) has a concave bottom that matches approximately the diameter of the center conductor (85) and a width that allows it to slide-fit into the slot of the slabline (84), (84A). The probe is attached to a support body (802) which is held in place by the two pre-loaded steel angles (86) also shown in front view (96) and (71) in FIGS. 9 and 7 correspondingly. The eccentric rotating cam mechanism (80) brushes or slides on its periphery (assuming proper lubrication) or rolls, on the support body (802) and pushes the said body downward towards the center conductor (85), against the upward force of the pair of spring-loaded blades (86), thus controlling the amplitude of r. To enable low friction contact between the cam (80) and the support block (802) (i.e., rolling), and eliminate the requirement for ongoing lubrication, the bottom of the eccentric rotating disc (cam) (80) can be equipped with a small ball- or roller-bearing (100), (80A) or similar mechanism, allowing it to minimize friction and roll smoothly on the support body (76), (802). The cam (80) is attached to the axis (81) of the remotely controlled vertical motor (801), supported by carriage (82) who's horizontal position and thus the phase of r is controlled by the ACME (89), which moves it aligned with the slabline on a high precision linear slide (88) and support platform (87).

Figure 9:
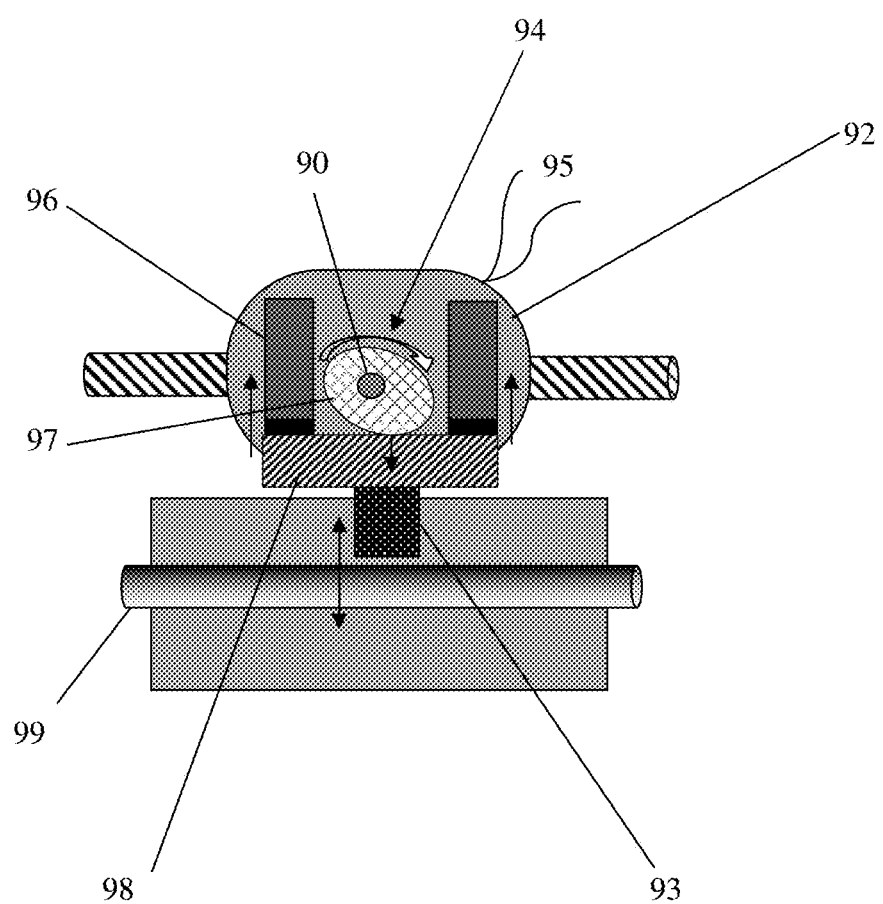
FIG. 9 depicts a front view of the piston-like vertically moving tuning probe driven by the eccentrically rotating cam brushing on the support block mechanism (see ref. 9).

FIG. 9 shows a front view of the mechanism for better understanding. The tuning probe (93) is held by the support block (98), which is pushed downwards (towards the center conductor (99) of the slabline) against the pre-loaded spring force of the two narrow steel angles (96), or a single wide steel angle (120), by the eccentrically rotating (94) cam (97) around the axis (90) of the remotely controlled (95) motor (92). This mechanism has a typical height of H2 (FIG. 8) which is barely higher than the simple rotating tuning probe mechanism H3 shown in FIG. 3B. An overall estimate yields a maximum total height of 1.5" for the slabline and 1.5" for the motor for a total of 3", less than half the typical 6.6" of the vertical axis tuner (see ref. 3 and FIG. 4).

Figure 10:
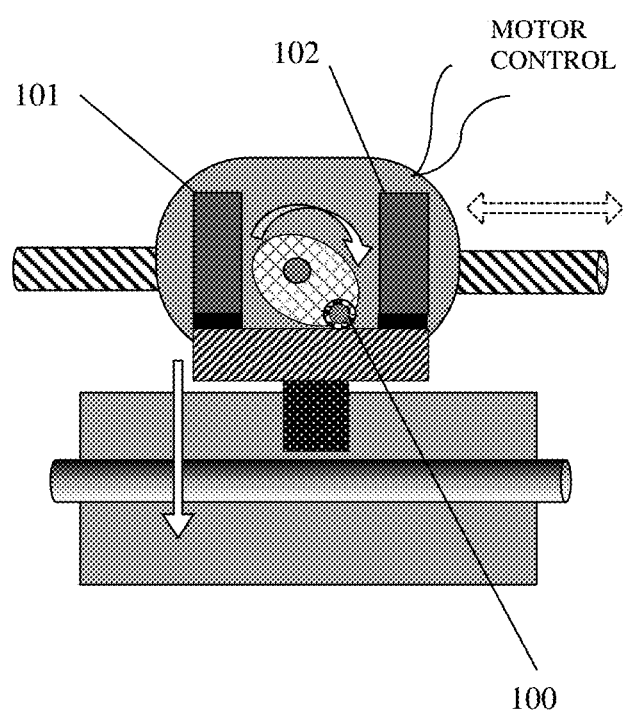
FIG. 10 depicts a front view of the piston-like vertically moving tuning probe driven by the eccentrically rotating (cam, see ref. 9) rolling on the support block.
Figure 12:
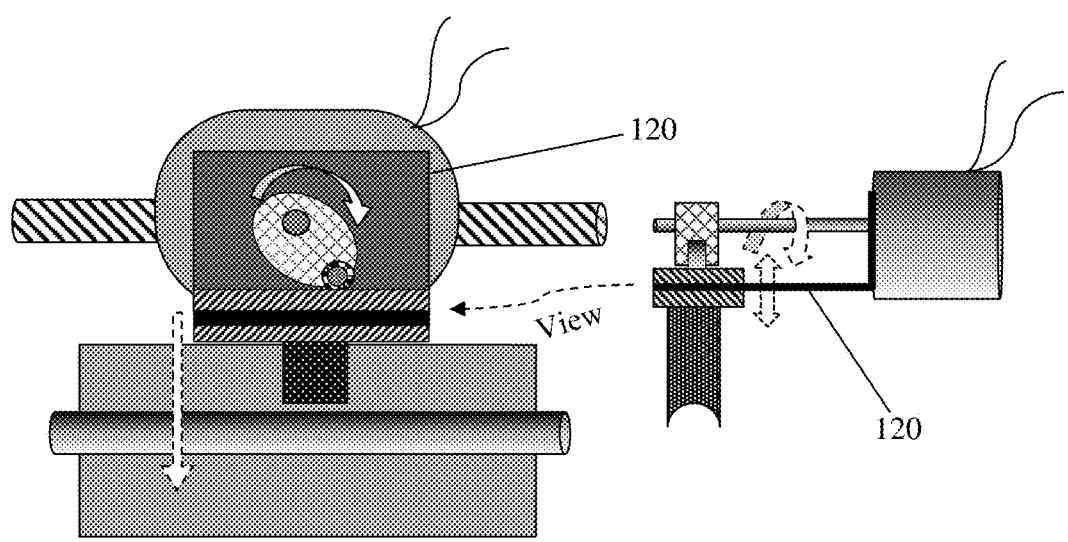
FIG. 12 depicts the upward pre-loaded mechanism using a wide single steel angle.

FIG. 12 shows a slightly different embodiment whereby the two narrow steel angles (101) and (102), FIG. 10, of the vertical control mechanism are replaced by a single wide steel angle (120), FIG. 12, which extends over the width if the carriage and offers better tilting resistance to the varying pressure applied by the rotating cam.

Figure 13:
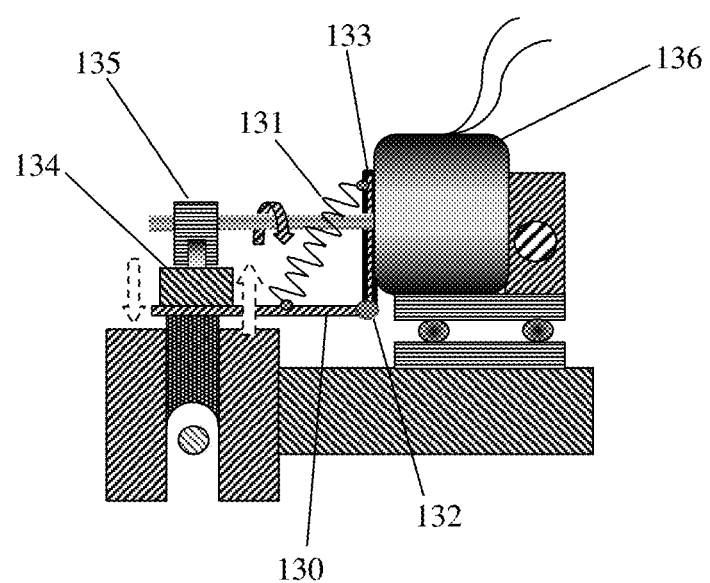
FIG. 13 depicts a second embodiment where instead of the preloaded steel angle one uses two wide plates held at square angle to each-other using a hinge and pulled together by two springs.

In a further embodiment the preloaded steel angles (96), (101), (102) used to lift the support block (98), (134) upwards can be replaced by a mechanism involving two plates (FIG. 13), a horizontal plate (130) and a vertical plate (133) interleaved at a square angle using a hinge (132) and pulled together by two parallel springs (131) against the downward force exercised by the cam (135). The springs are anchored between the horizontal plate (130) and the vertical plate (133), which is attached to the motor (136); (the two springs (131) replace the steel angles (96) and pull the plates together to create the upwards lifting force.

Figure 14:
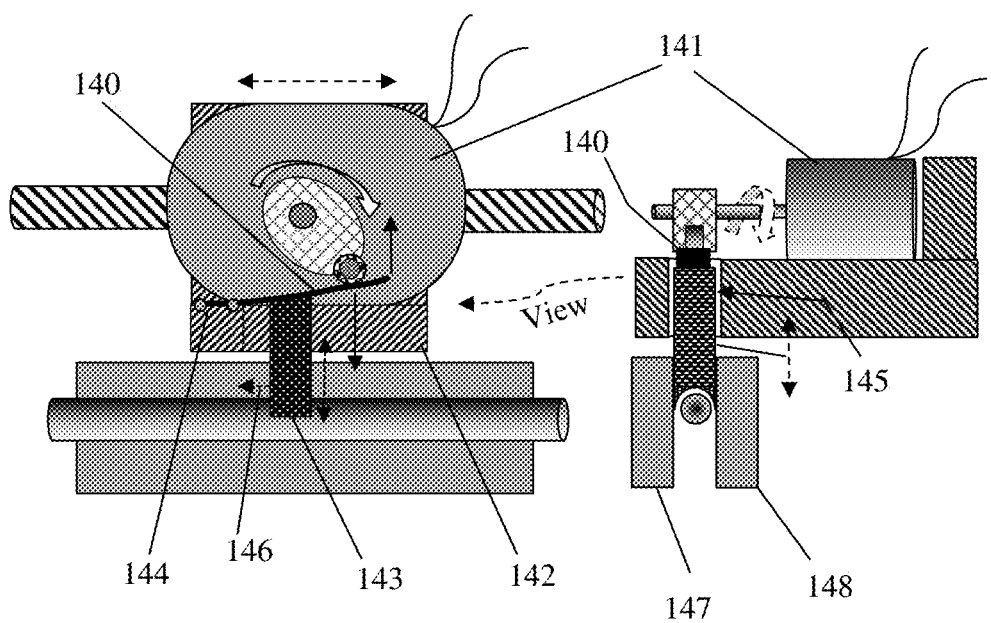
FIG. 14 depicts a third embodiment where the spring-loaded mechanism holding the tuning probe operates parallel to the slabline axis.

FIG. 14 shows a different embodiment of the piston-like probe movement control. In order to avoid the sidewise tilting (803) of the tuning probe which follows the arc defined by the horizontal part of the blade (86) or the plate (130) an upwards preloaded steel blade (140), which holds the tuning probe (143), is inserted parallel to the slabline and is pushed downwards by the cam mechanism as before. The blade (140) is anchored (144) on the main body of the fork-shaped support block (142), which is attached to the motor (141) and pulls the tuning probe upwards against the pressure of the eccentrically rotating cam. The tuning probe traverses vertically the gap (145) formed by the two legs of the fork-shaped support block (142) and penetrates slide-fitting into the slot, formed by the two sidewalls (147), (148) of the slabline. A small horizontal tilting (146) of the tuning probe, created by this movement, has a smaller detrimental effect to the tuner reflection response than a sidewise tilting.

The concept of low-profile impedance tuner has been disclosed using a number of embodiments. Obvious alternatives to the disclosed concept of linear quasi vertically moving RF tuning probes, controlled by a compact eccentrically rotating cam mechanism are imaginable but shall not impede on to the validity of the present invention.

What is claimed is:
1. A method for precisely controlling a vertical penetration of a tuning probe into a slabline of a slide screw impedance tuner, wherein the slide screw tuner comprises:
the slabline with a center conductor,
a mobile carriage, sliding along the slabline, being controlled by a first stepper motor and carrying a second stepper motor, both stepper motors being remotely controlled,
and wherein
an axis of the second stepper motor is perpendicular to the slabline, and controls an eccentrically rotating disc, whose rotation plan is parallel to the slabline, and which said disc pushes a support block towards the center conductor, which said support block is linked with the mobile carriage and is spring-loaded away from the center conductor,
and wherein
a metallic tuning probe is attached to the support block and is insertable, piston-like into the slabline, perpendicularly to the center conductor.

2. The method for precisely controlling the vertical penetration of a tuning probe into a slabline of a slide screw impedance tuner of claim 1,
wherein
the support block is attached to a horizontal plate, which is linked perpendicularly to a vertical plate using a hinge and held by springs anchored on the plates,
and wherein
the vertical plate is attached to the mobile carriage and the horizontal plate is pre-loaded by the springs away from the center conductor.

3. The method for precisely controlling the vertical penetration of a tuning probe into a slabline of a slide screw impedance tuner of claim 1,
wherein
the support block is attached to a horizontal wall of a single, wide, pre-loaded away from the center conductor steel angle, of which a vertical wall is attached to the mobile carriage.

4. The method for precisely controlling the vertical penetration of a tuning probe into a slabline of a slide screw impedance tuner of claim 1
wherein
the support block is linked with the mobile carriage using two steel angles of which a vertical wall is attached to the mobile carriage and a horizontal wall is attached to the support block, said angles being pre-loaded away from the center conductor.

5. The method for precisely controlling the vertical penetration of a tuning probe into a slabline of a slide screw impedance tuner of claim 1
wherein
the support block is formed by a steel blade parallel to the slabline, anchored on the mobile carriage, pre-loaded away from the center conductor and pushed from the top towards the center conductor by the eccentrically rotating disc, and carrying on its bottom the tuning probe.

6. The method for precisely controlling the vertical penetration of a tuning probe into a slabline of a slide screw impedance tuner of claim 1
wherein
the eccentrically rotating disc pushes the support block using a rolling contact via a ball bearing.

* * * * *